United States Patent
Hoogzaad

(10) Patent No.: US 6,323,700 B2
(45) Date of Patent: Nov. 27, 2001

(54) DOUBLE INPUT BUFFER FOR TRACK-AND-HOLD AMPLIFIER

(75) Inventor: Gian Hoogzaad, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/746,026

(22) Filed: Dec. 21, 2000

(30) Foreign Application Priority Data

Dec. 24, 1999 (EP) .................................................. 99204526

(51) Int. Cl.[7] ....................................................... H03K 3/00
(52) U.S. Cl. ............................................. 327/108; 327/560
(58) Field of Search ........................... 327/108–112, 560, 327/563; 326/82–84, 86; 330/252, 253

(56) References Cited

U.S. PATENT DOCUMENTS

| | | | |
|---|---|---|---|
| 5,583,459 | 12/1996 | Sone | 327/95 |
| 5,654,665 | * 8/1997 | Menon et al. | 327/543 |
| 5,939,907 | * 8/1999 | Miyazaki | 327/108 |

* cited by examiner

Primary Examiner—Kenneth B. Wells
(74) Attorney, Agent, or Firm—Steven R. Biren

(57) ABSTRACT

The present invention relates to an input buffer for a switched emitter follower-like track-and-hold amplifier comprising an input stage with an input transistor (Q1), a first diode (Q2, Q2b), a cathode side of which first diode (Q2, Q2b) is connected to an emitter of the input transistor (Q1), a first current source (4) between on the one hand the junction between the cathode of the first diode (Q2, Q2b) and the emitter of the input transistor (Q1) and on the other hand a first supply voltage line (2), an anode of the first diode (Q2, Q2b) being connected to a track-and-hold controlled emitter follower (6). The first current source (4) is a non-switched constant current source, and a second current source (M1) is connected between a collector of the input transistor (Q1) and a second supply voltage (3). A second transistor (M2, M2b) comprising a control electrode, a current input electrode and a current output electrode is connected with the control electrode to the junction (n1) between the collector of the input transistor (Q1) and the second current source (M1), with the current input electrode to the second supply voltage (3) and with the current output electrode to the anode of the first diode (Q2, Q2b).

7 Claims, 2 Drawing Sheets

DOUBLE INPUT BUFFER FOR TRACK-AND-HOLD AMPLIFIER

BACKGROUND OF THE INVENTION

The invention relates to an input buffer for a switched emitter follower-like track-and-hold amplifier comprising an input stage with an input transistor, a first diode, a cathode side of which first diode is connected to an emitter of the input transistor, a first current source between on the one hand the junction between the cathode of the first diode and the emitter of the input transistor and on the other hand a first supply voltage line, an anode of the first diode being connected to a track-and-hold controlled emitter follower.

Such an input buffer is known from U.S. Pat. No. 5,583,459. Input buffers described therein have a current source connected between the anode of the first diode and a second supply voltage. The presence of a diode is crucial to disconnect the input signal during the hold-mode.

It is known to embody the current source between the anode of the first diode and the second voltage supply with MOSFETs. A problem with such a current source embodied with MOSFETs is the nonlinear junction impedance thereof. When high input frequencies are used as input signals to this input buffer it is especially the nonlinear junction capacitance that plays a prominent role, at lower frequencies the nonlinear junction resistance also will play a role. The nonlinear junction impedance leads to distortion of the signal at the anode of the first diode. That distortion cannot be prevented by increasing the current through the current source since more current requires a proportionally larger current source with inherently larger nonlinear junction impedance. Furthermore a strict trade-off exists between available voltage headroom, noise and nonlinear output impedance of the current source.

SUMMARY OF THE INVENTION

It is an object of the present invention to provide an input buffer in which the trade-off between voltage headroom, noise and nonlinear output impedance has substantially decreased.

An input buffer according to the invention thereto is characterised in that the first current source is a non-switched constant current source, in that a second current source is connected between a collector of the input transistor and a second supply voltage, in that a second transistor comprising a control electrode, a current input electrode and a current output electrode is connected with the control electrode to the junction between the collector of the input transistor and the second current source, with the current input electrode to the second supply voltage and with the current output electrode to the anode of the diode.

Thereby it is achieved that a nonlinear output impedance of the second transistor does not substantially interact in the signal path. Any nonlinear current flows through the second transistor itself. A consequence of connecting the second transistor according to the invention is that the junction between the collector of the input transistor and the second supply voltage has an AC content that is attenuated relative to the input AC content by the gain of the second transistor. Consequently a good current source, also in terms of noise, can be selected as the second current source.

In a preferred embodiment of an input buffer according to the invention the second current source comprises a MOSFET.

Thereby it is achieved that a threshold voltage is available for VGT of that MOSFET.

In a further preferred embodiment of the invention the second transistor is a MOSFET.

Thereby it is achieved that the voltage at the anode of the first diode can reach up to the VGT of the second transistor. That is of advantage in situations where the second supply voltage is a low voltage.

The trade-off between voltage headroom, noise and non-linear output impedance, known from the prior art, has substantially decreased in an input buffer according to the invention.

BRIEF DESCRIPTION OF THE DRAWING

The invention shall now be described with reference to the accompanying drawings in which.

DESCRIPTION OF THE PREFERRED EMBODIMENTS

Figure 1:
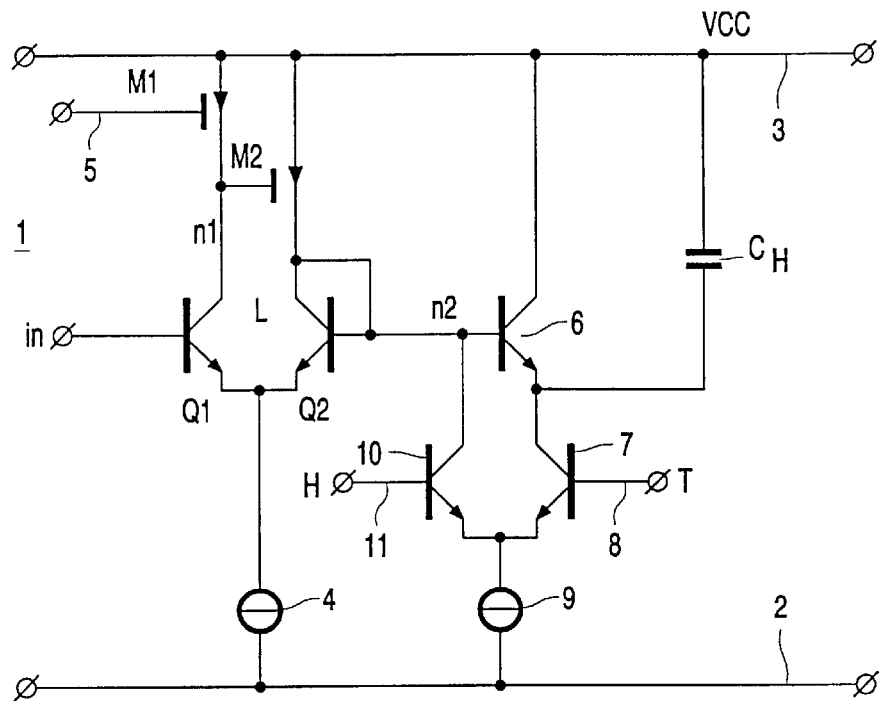
FIG. 1 shows a first embodiment of an input buffer according to the present invention.

FIG. 1 shows an input buffer 1 connected between a first supply voltage line 2 and a second supply voltage line 3. An input transistor Q1 has its emitter connected to a first side of a first current source 4. The second side of current source 4 is connected to supply voltage line 2. The emitter of transistor Q1 is also connected to an emitter of transistor Q2. A base of transistor Q2 is connected to a collector of transistor Q2. The collector of transistor Q2 is connected to a drain of a MOSFET M2. A source of MOSFET M2 is connected to supply voltage line 3. A gate of MOSFET M2 is connected to a collector of transistor Q1. The junction between the collector of transistor Q1 and the gate of MOSFET M2 is connected to a drain of a MOSFET M1. A source of MOSFET M1 is connected to supply voltage line 3. A gate of MOSFET M1 is connected through a line 5 to a source of constant voltage (not shown). In the present embodiment transistor Q2 has been described with its base connected to its collector. Functionally thereby transistor Q2 operates as a diode, the cathode of which corresponds to the emitter of transistor Q2 and the anode of which corresponds to the base and collector of transistor Q2. It is to be noted that in the present invention the functioning of the input buffer is independent of the choice for a single diode at the position of transistor Q2 or for a transistor with its base and collector connected together. In the claims any transistor that is wired and functions as a diode, like transistor Q2 in FIG. 1 will be called a diode.

The base of transistor Q2 is connected to a base of transistor 6. A collector of transistor 6 is connected to the second supply voltage line 3, an emitter of transistor 6 is connected to a collector of a transistor 7 and to a first side of a capacitor $C_H$. A second side of capacitor $C_H$ is connected to the second supply voltage line 3. A base of transistor 7 is connected by a line 8 to a source of track signals T. An emitter of transistor 7 is connected to a first side of a current source 9. A second side of current source 9 is connected to first supply voltage line 2. The first side of current source 9 is also connected to an emitter of a transistor 10. A base of transistor 10 is connected through a line 11 to a source of hold signals H. A collector of transistor 10 is connected to a junction between the base of transistor Q2 and the base of transistor 6. The junction between the collector of transistor Q1, the gate of MOSFET M2 and the drain of MOSFET M1 will be called node n1 hereinafter. The junction between the base of transistor Q2, the base of transistor 6 and the collector of transistor 10 will be called node n2 hereinafter.

MOSFET M1 operates as a constant current source. Transistors Q1 and Q2 together with constant current source 4 operate to apply a current into node n2 that is equal to the current input at the base of transistor Q1. MOSFET M2 with its gate connected to node n1 completes a loop L. Any nonlinear output impedance of MOSFET M2 does not interact in the signal path: any nonlinear current flows through the MOSFET M2 itself which operates as a feedback transistor. As a consequence node n1 has an AC content that is attenuated related to the AC content of the input signal at the base of transistor Q1 by the gain of MOSFET M2. It is to be noted that MOSFET M2 operates preferably, but not necessarily in its saturation range.

It is to be noted that interaction in the signal path of any nonlinear output impedance of MOSFET M1 has substantially decreased. The loop formed by MOSFET M2, transistor Q2, transistor Q1 and current source 4 effectively decreases any consequences of nonlinearity in the output impedance of MOSFET M1 such that AC signals at the input of Q1 have been attenuated at node n1 by the gain of MOSFET M2.

An input buffer according to FIG. 1 can accommodate large signals at the base of transistor Q1. A threshold voltage is available for VGT of MOSFET M1. Also the output node n2 can reach up to VGT of MOSFET M2.

Though MOSFET M2 has been described hereinbefore as a MOSFET it is also possible to make use of PNP transistors. Also although M1 has been described as a single MOSFET it is possible to apply other kinds of current sources.

It is to be noted that the input buffer shown in FIG. 1 can hardly operate as a track-and-hold amplifier since during a hold-mode a voltage at node n2 can not drop since transistor M2 essentially drains all currents. Nevertheless it may function as an input buffer.

Figure 2:
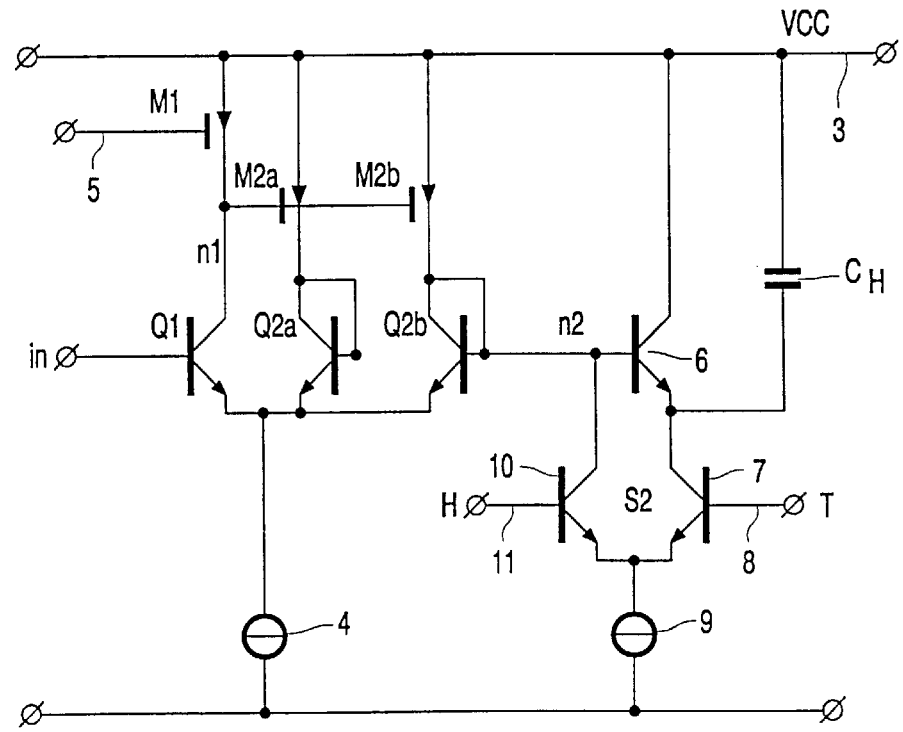
FIG. 2 shows a second embodiment of an input buffer according to the present invention.

FIG. 2 therefore shows a further embodiment of an input buffer according to the invention which may indeed function as a track-and-hold amplifier. Like elements have been indicated by the same reference numerals as in FIG. 1. Instead of transistor Q2 two transistors Q2a and Q2b are now present both with their emitters connected to the emitter of transistor Q1 and both with their bases connected to their collectors. The collector of transistor Q2a is connected to a drain of a MOSFET M2a. A source of MOSFET M2a is connected to supply voltage line 3 and a gate of MOSFET M2a is connected to node n1. The collector of transistor Q2b is connected to a drain of a MOSFET M2b. A source of MOSFET M2b is connected to supply voltage line 3 and a gate of MOSFET M2b is connected to node n1. The base of transistor Q2b is connected to node n2.

It is to be noted that node n2, transistor 6, capacitor $C_H$, and switch 52 together form a well known switched emitter follower-like track-and-hold circuit, that is known in the art and the operation of which is considered to be known to a person skilled in the art and will therefore not further be described.

An extra branch of transistors M2a and Q2a keeps the loop intact and allows for the branch of transistors M2b and Q2b to be removed from the loop thereby allowing node n2 to drop. Thus the loop L remains intact and is not interrupted, like in the circuit according to FIG. 1, during a hold-mode. In the embodiment according to FIG. 2 node n2 has to drop in voltage to turn off transistors Q2b and Q3.

A further advantage of an input buffer according to the invention is a substantial decrease in the signal path of a non linear base current which itself is due to collector-base modulation of transistor 6. The collector of transistor 6 is at a fixed voltage, namely the voltage VCC at the supply voltage line 3. During tracking there is a signal at node n2 which is the same signal as the signal present at the base of transistor Q1. That signal because of the fixed voltage at the collector of transistor 6 leads to a nonlinear base current into transistor 6. However, due to the loop L formed by the transistors M2 and M2a/M2b, respectively these nonlinear base currents are effectively eliminated.

Figure 3:
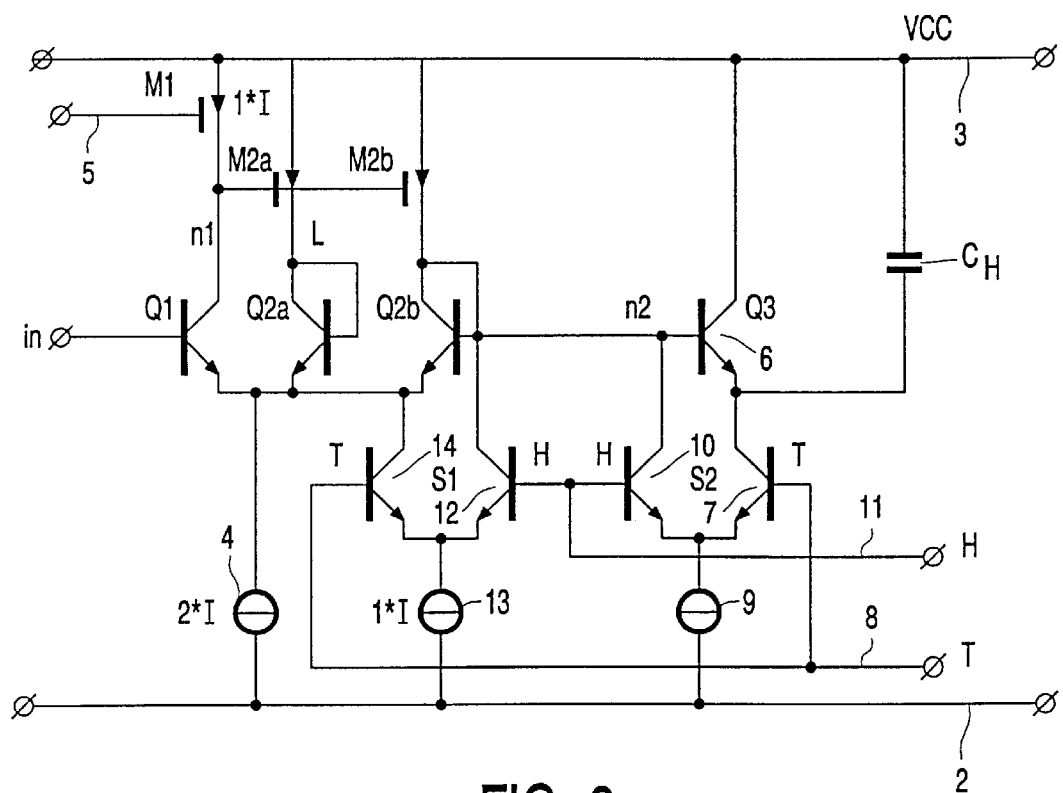
FIG. 3 shows a third embodiment of an input buffer according to the present invention.

FIG. 3 shows a further embodiment of an input buffer according to the invention. Like elements have been indicated by the same reference numerals as in FIGS. 1 and 2. Instead of transistor Q2 two transistors Q2a and Q2b are now present both with their emitters connected to the emitter of transistor Q1 and both with their bases connected to their collectors. The collector of transistor Q2a is connected to a drain of a MOSFET M2a. A source of MOSFET M2a is connected to supply voltage line 3 and a gate of MOSFET M2a is connected to node n1. The collector of transistor Q2b is connected to a drain of a MOSFET M2b. A source of MOSFET M2b is connected to supply voltage line 3 and a gate of MOSFET M2b is connected to node n1. The base of transistor Q2b is connected to node n2. Node n2 is also connected to a collector of a transistor 12. A basis of transistor 12 is connected to line 11. An emitter of transistor 12 is connected to a first side of a current source 13. A second side of current source 13 is connected to supply voltage line 2. A junction between the emitter of transistor 12 and the first side of current source 13 is connected to an emitter of a transistor 14. A base of transistor 14 is connected to line 8. A collector of transistor 14 is connected to the junction between the emitters of transistors Q1, Q2a and Q2b. Furthermore it is shown that the current source formed by MOSFET M1 generates a current of strenght 1*I. Current source 4 generates a current of strength 2*I and current source 13 generates a current of strength 1*I.

Transistors 7 and 10 and current source 9 together form a switch S2 and transistors 12 and 14 and current source 13 together from a switch S1. Switches S1 and S2, transistor 6 and capacitor $C_H$ together form a switched emitter follower topology track-and hold amplifier that is known in the art and the operation of which will not further be described inhere.

An extra branch of transistors M2a and Q2a keeps the loop intact and allows for the branch of transistors M2b and Q2b to be removed from the loop thereby allowing node n2 to drop. Switch SI prevents that node n1 drops in voltage when switching takes place from track mode to hold mode. By the choices of a current 1*I through M1 and 2*I through current source 4 there is always a current of strenght 1*I through M2a and Q2a. Thereby the loop L remains intact and is not interrupted like in the circuit according to FIG. 1 when during a hold node n2 drops in voltage to turn off transistors 6 and Q2. In the embodiment according to FIG. 2 node n2 has to drop in voltage to turn off transistors Q2b and Q3. The switch S1 delivers in the hold mode the current that is supplied by transistors M2b to node n2. This helps pulling down the voltage on node n2.

A further advantage of an input buffer according to the invention is a substantial decrease in the signal path of a nonlinear base current which itself is due to collector-base modulation of transistor 6. The collector of transistor 6 is at a fixed voltage, namely the voltage VCC at the supply voltage line 3. During tracking there is a signal at node n2 which is the same signal as the signal present at the base of transistor Q1. That signal because of the fixed voltage at the collector of transistor 6 leads to a nonlinear base current into transistor 6. However, due to the loop L formed by the transistors M2 and M2a/m2b, respectively these nonlinear base currents are effectively eliminated.

What is claimed is:

1. Input buffer for a switched emitter follower track-and-hold amplifier comprising an input stage with an input transistor (Q1), a first diode (Q2, Q2b), a cathode side of which first diode (Q2, Q2b) is connected to an emitter of the input transistor (Q1), a first current source (4) between on the one hand the junction between the cathode of the first diode (Q2, Q2b) and the emitter of the input transistor (Q1) and on the other hand a first supply voltage line (2), an anode of the first diode (Q2, Q2b) being connected to a track-and-hold controlled emitter follower (6), characterised in that the first current source (4) is a non-switched constant current source, in that a second current source (M1) is connected between a collector of the input transistor (Q1) and a second supply voltage (3), in that a second transistor (M2, M2b) comprising a control electrode, a current input electrode and a current output electrode is connected with the control electrode to the junction (n1) between the collector of the input transistor (Q1) and the second current source (M1), with the current input electrode to the second supply voltage (3) and with the current output electrode to the anode of the first diode (Q2), in that a second diode (Q2a) is connected with a cathode to the junction between the cathode of the first diode (Q2b) and the emitter of the input transistor (Q1), and in that a third transistor (M2a) comprising a control electrode, a current input electrode and a current output electrode is connected with the control electrode to the junction (n1) between the collector of the input transistor (Q1) and the second current source (M1), with the current input electrode to the second supply voltage (3) and with the current output electrode to the anode of the second diode (Q2a).

2. Input buffer according to claim 1 characterised in that the second current source (M1) comprises a MOSFET, in that the current input electrode of the MOSFET is a source, in that the control electrode of the MOSFET is a gate and in that the current output electrode of the MOSFET is a drain.

3. Input buffer according to claim 1, characterised in that the second transistor (M2, M2b) is a MOSFET, in that the current input electrode of the second transistor (M2, M2b) is a source of MOSFET, in that the control electrode of the second transistor (M2, M2b) is a gate of the MOSFET and in that the current output electrode of the second transistor (M2, M2b) is a drain of the MOSFET.

4. Input buffer according to claim 1, characterised in that the third transistor (M2a) is a MOSFET, in that the current input electrode of the third transistor (M2a) is a source of the MOSFET, in that the control electrode of the third transistor (M2a) is a gate of the MOSFET and in that the current output electrode of the third transistor (M2a) is a drain of the MOSFET.

5. Input buffer according to claim 1, characterised in that a third current source (13) is connected between the first supply voltage (2) and a junction between emitters of a fourth (14) and a fifth transistor (12), in that a collector of the fourth transistor (14) is connected to the cathode of the first diode (Q2b), in that a collector of the fifth transistor (12) is connected to the anode of the first diode (Q2b), in that a base of the fourth transistor (14) is connected to a source of a track signal (T) and in that a base of the fifth transistor (12) is connected to a source of a hold signal (H).

6. Input buffer according to claim 5 characterised in that values of currents generated by the second (M1) and the third current sources (13) are substantially equal and in that a value of a current generated by the first current source (4) is twice the value of any of the currents generated by the second (M1) and the third current sources (13).

7. Input buffer for an emitter follower amplifier comprising an input stage with an input transistor (Q1), a first diode (Q2, Q2b), a cathode side of which first diode (Q2, Q2b) is connected to an emitter of the input transistor (Q1), a first current source (4) between on the one hand the junction between the cathode of the first diode (Q2, Q2b) and the emitter of the input transistor (Q1) and on the other hand a first supply voltage line (2), an anode of the first diode (Q2, Q2b) being connected to an emitter follower (6), characterised in that the first current source (4) is a non-switched constant current source, in that a second current source (M1) is connected between a collector of the input transistor (Q1) and a second supply voltage (3), in that a second transistor (M2, M2b) comprising a control electrode, a current input electrode and a current output electrode is connected with the control electrode to the junction (n1) between the collector of the input transistor (Q1) and the second current source (M1), with the current input electrode to the second supply voltage (3) and with the current output electrode to the anode of the first diode (Q2).

* * * * *